(12) United States Patent
Carkner

(10) Patent No.: US 8,085,164 B2
(45) Date of Patent: Dec. 27, 2011

(54) APPARATUS AND METHOD FOR MONITORING A VARIETY OF RESOURCE CONSUMPTION METERS

(75) Inventor: Steve Carkner, Ottawa (CA)

(73) Assignee: Blueline Innovations, Moncton, New Brunswick (CA)

( * ) Notice: Subject to any disclaimer, the term of this patent is extended or adjusted under 35 U.S.C. 154(b) by 1080 days.

(21) Appl. No.: 11/610,222

(22) Filed: Dec. 13, 2006

(65) Prior Publication Data

US 2008/0143321 A1    Jun. 19, 2008

(51) Int. Cl.
*G08B 23/00*   (2006.01)
(52) U.S. Cl. .................. 340/870.02; 324/76.11
(58) Field of Classification Search ......... 340/870.02–870.03; 324/76.11
See application file for complete search history.

(56) References Cited

U.S. PATENT DOCUMENTS

| | | | | |
|---|---|---|---|---|
| 4,803,632 | A * | 2/1989 | Frew et al. | 705/412 |
| 5,214,587 | A * | 5/1993 | Green | 702/60 |
| 5,767,790 | A * | 6/1998 | Jovellana | 340/870.02 |
| 5,808,558 | A * | 9/1998 | Meek et al. | 340/870.01 |
| 5,959,549 | A * | 9/1999 | Synesiou et al. | 340/870.02 |
| 6,853,309 | B1 * | 2/2005 | Schroter | 340/870.02 |
| 6,956,500 | B1 * | 10/2005 | Ducharme et al. | 340/870.02 |
| 7,049,976 | B2 * | 5/2006 | Hunt et al. | 340/870.02 |

* cited by examiner

*Primary Examiner* — Albert Wong
(74) *Attorney, Agent, or Firm* — Miller Thomson LLP

(57) ABSTRACT

An apparatus is disclosed for attachment to a resource consumption meter emitting and detecting a signal having a first frequency relative to the rate of metered resource consumption. The apparatus comprises at least one signal detection means adapted to detect said signal from said resource consumption meter; and, a circuit operatively connected to the signal detection means and adapted for interpreting the signal for a human. A method for multi-mode operation of the apparatus is disclosed so that it is possible for the apparatus to automatically detect the type of resource consumption meter it is attached to and operate accordingly.

17 Claims, 10 Drawing Sheets

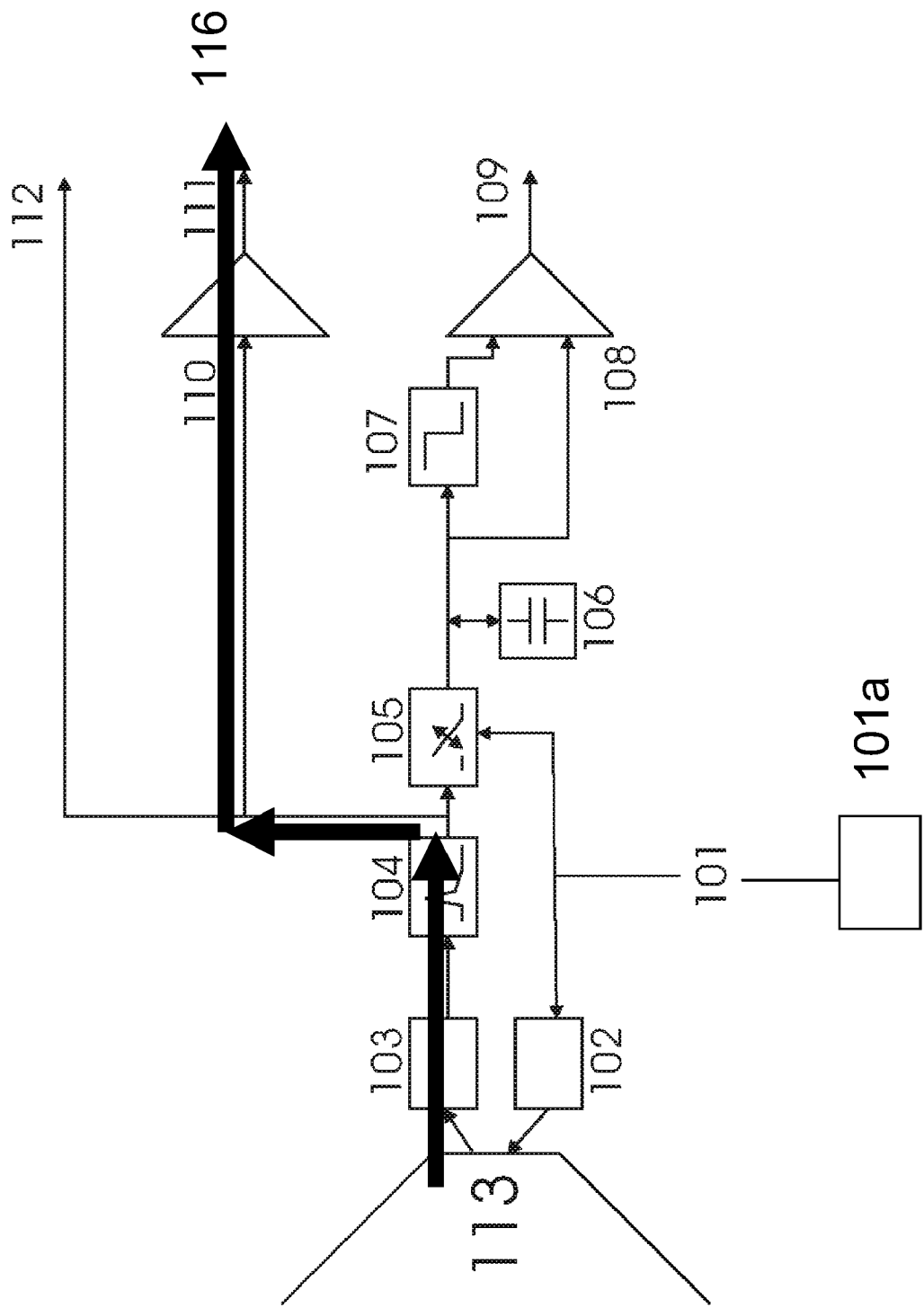

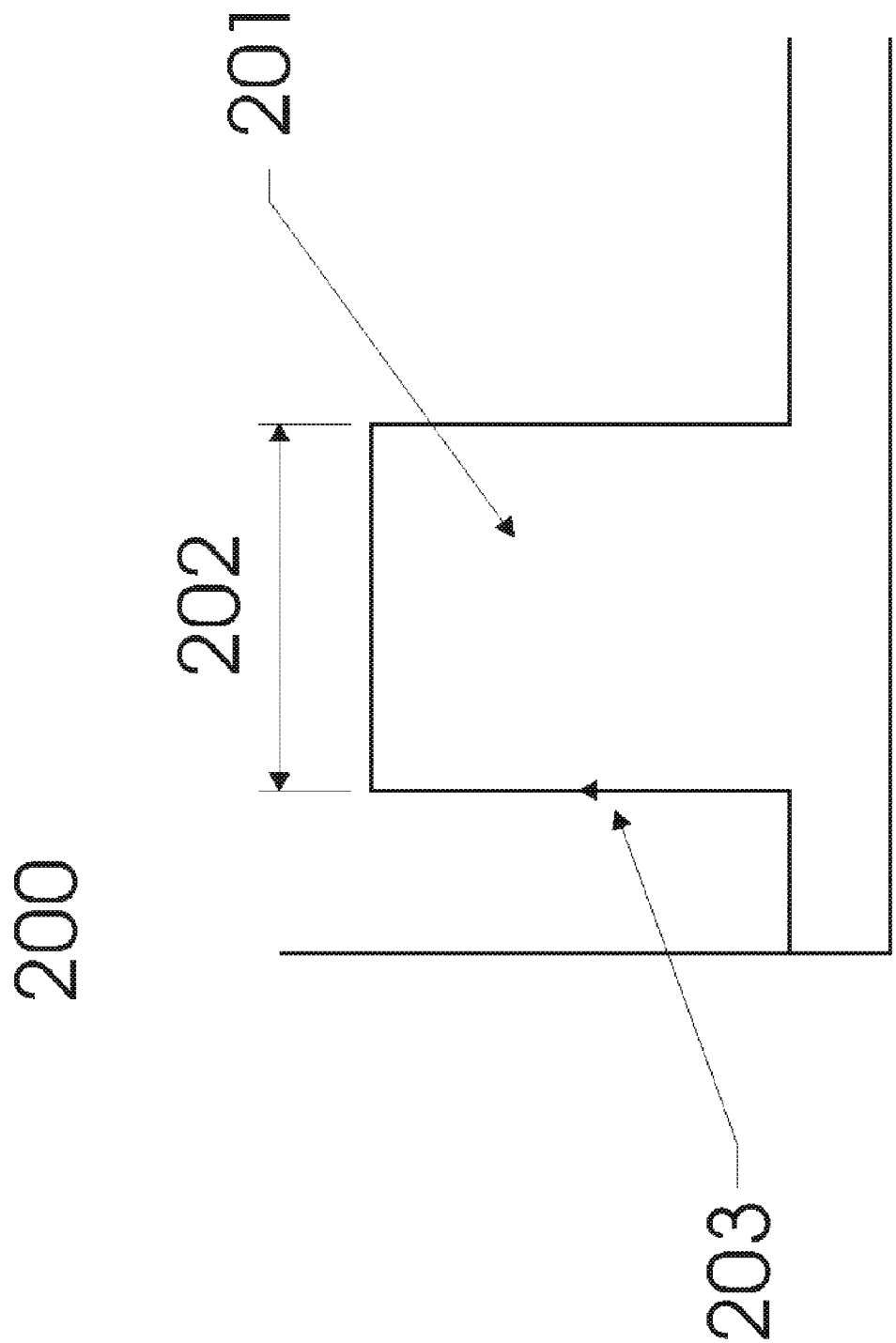

APPARATUS AND METHOD FOR MONITORING A VARIETY OF RESOURCE CONSUMPTION METERS

BACKGROUND OF THE INVENTION

1. Field of the Invention

This invention relates to the field of electrical systems and devices and more specifically to an apparatus and method for monitoring a variety of resource consumption meters.

2. Discussion of the Prior Art

The ability to measure the operation of a utility meter without physically altering the meter itself is of significant importance to the millions of consumers who would like to continuously monitor their use of the limited natural resources of our planet, without the expense of replacing their existing metering systems with advanced electronic metering systems that may be design to only provide usage data to the utility company themselves, not the consumer themselves.

One of the most common requirements for monitoring is to count the revolutions of the spinning disk in an analog style electricity meter. Existing systems require installation inside the electricity meter with close proximity to the disk.

There exists a need for a non-invasive detection system that can function on a wide variety of meter types and does not require a high degree of accuracy in locating the sensor, and does not require user knowledge of the type of meter they are installing the system on.

OBJECTS OF THE INVENTION

It is an object of the present invention to overcome the deficiencies noted in the prior art.

It is a further object of the present invention to provide an improved apparatus and method for non-invasive measurement of a resource consumption meter.

SUMMARY

One embodiment of the invention comprises an apparatus for monitoring a variety of resource consumption meters through the use of adaptive illumination, detection and signal processing. For this embodiment of the invention, the resource consumption meter emits a signal having a frequency relative to the rate of metered resource consumption. In this embodiment, the apparatus comprises at least one signal detection means and a circuit operatively connected to the signal detection means for the interpretation of the signal by a human.

In another embodiment of the invention the apparatus is an optical apparatus and the signal emitted by the resource consumption meter is an energy emission detectable by the optical apparatus. The energy emission may comprise light in the visible spectrum, light in the invisible spectrum or an energy emission in another part of the electromagnetic spectrum.

In one embodiment of the invention, the apparatus is adapted for a digital resource consumption meter that emits a signal directly detectable by an optical apparatus.

In another embodiment of the invention the apparatus is adapted for an analogue resource meter such as one having a spinning disk. In this embodiment there is a need to convert the analogue signal, such as the rate of rotation of the spinning disk, into a signal detectable by the optical apparatus. In this embodiment the apparatus includes an energy emitter to direct energy onto the analogue device, a reflector to direct energy back from the analogue device and an energy detector to detect the reflected energy. This embodiment of the apparatus may have more than one energy detector.

In one embodiment of the invention there is provided a circuit operatively connected to the signal detector. In this embodiment of the invention, the circuit includes a discriminator adapted to block input signals having a second frequency lower than the first frequency. The second frequency represents spurious energy signals that might be caused by sunlight reflecting into the signal detector. Such reflections would occur at a lower frequency than the energy reflected by, say, a rotating disk type electrical metering device. The discriminator also acts as an amplifier to amplify the first frequency signal.

In one embodiment of the invention there is provided an apparatus for monitoring a resource consumption meter emitting a signal having a first frequency relative to a rate of metered resource consumption, wherein the apparatus comprises: at least one signal detection means; and, a circuit operatively connected to the at least one signal detection means and adapted for converting detected signals into human readable output indicative of the rate of metered resource consumption. The circuit is adapted to provide three optional circuit paths representing one of: a sample and hold mode of operation adapted for an analogue meter having a moving indicator indicative of resource consumption; a digitizing mode of operation; and, an analog to digital mode of operation.

In another embodiment of the invention the sample and hold mode of operation circuit path comprises an energy emitter adapted to illuminate the moving indicator with a plurality of short pulses. Each pulse of the plurality of short pulses is a fast-rise square wave pulse having an adjustable period and power. There is also included an energy detector adapted to detect reflected energy from the moving indicator during the defined duration and an energy emitter pulsing means operatively connected to the energy emitter and adapted for providing a plurality of short pulses over the defined duration. A discriminator is operatively connected to the energy detector for blocking spurious signals and amplifying permitted signals. Signal storage means is operatively connected to the discriminator for storing a predetermined number of signals of increasing magnitude over the duration until fully charged. The storage means will discharge a discharge signal if exposed to a predetermined number of signals that are decreasing in magnitude over the duration. A signal comparator is operatively connected to the storage means for receiving the discharge signal and removing from the discharge signal an ambient signal to create an output signal. The comparator amplifies the output signal. There is also included an analogue to digital converter adapted to receive the analogue output signal and convert it into a digital signal so that a connected microprocessor can receive and interpret the digital signal.

In yet another embodiment of the invention the digitizing mode of operation pathway comprises an energy emitter adapted to illuminate the moving indicator with a plurality of short pulses having a defined duration; an energy detector adapted to detect reflected energy from the moving indicator during the defined duration; an energy emitter pulsing means operatively connected to the energy emitter and adapted for providing the plurality of short pulses over the defined duration; a discriminator operatively connected to the energy detector for blocking spurious signals and amplifying output signals; a digitizing element adapted for receiving the discriminator output signals and converting the discriminator output signals to digital signals. The discriminator output signals are fast time-varying signals of a predetermined magnitude and the digitizing element output signals are input into a microcontroller for interpretation. The digitizing element produces a digitizing element output as long as the predetermined magnitude remains above a predetermined level.

In one embodiment of the invention the digitizing mode of operation pathway comprises an energy detector adapted to detect emitted energy from a digital resource consumption meter; a discriminator operatively connected to the energy detector for blocking spurious signals and amplifying output signals; and, a digitizing element adapted for receiving the discriminator output signals and converting the discriminator output signals to digital signals. The discriminator output signals are fast time-varying signals of a predetermined magnitude and the digitizing element output signals are input into a microcontroller for interpretation.

In yet another embodiment of the invention the analogue to digital mode of operation circuit path comprises: a energy emitter adapted to illuminate the moving indicator with a plurality of short pulses having a defined duration; an energy detector adapted to detect reflected energy from the moving indicator during the defined duration; energy emitter pulsing means operatively connected to the energy emitter and adapted for providing the plurality of short pulses over the defined duration; a discriminator operatively connected to the energy detector for blocking spurious signals and amplifying permitted signals; an analogue to digital converter adapted to receive the permitted signals and convert the permitted signals to digital signals; and, a microprocessor adapted to receive and interpret the digital signals. The energy detector is an energy detector adapted to detect emitted energy from a digital resource consumption meter.

In another embodiment of the invention there is provided an apparatus for monitoring a resource consumption meter emitting a signal having a first frequency relative to a rate of metered resource consumption comprising: an energy emitter adapted for illuminating an analogue indicator wherein the analogue indicator is adapted to reflect energy as the signal to at least one energy detector. The embodiment includes a circuit operatively connected to the at least one energy detector and adapted for generating a signal for interpretation by a microprocessor. The circuit is adapted to provide three optional circuit paths representing one of: a first path for a sample and hold mode of operation adapted for an analogue meter having a moving indicator indicative of resource consumption; a second path for a digitizing mode of operation; and, a third path for an analog to digital mode of operation. In this embodiment there is provided a methodology of operating the apparatus in a multi-mode format comprising the following steps: selecting an off mode by disabling the energy emitter and said first, second and third paths; selecting a digital resource consumption meter detection mode by enabling the first path and disabling the energy emitter, the second path and the third path; selecting a digital resource consumption meter detection mode, wherein the digital resource consumption meter has a consumption indicator requiring external illumination, by enabling the energy emitter for external illumination and the first path; selecting an analogue spinning disk resource consumption meter mode by enabling the energy emitter and the first path; selecting an automatic gain control mode by enabling the energy emitter, the first path and the third path; selecting a digital "flashing light" resource consumption meter mode, wherein the flashing light relates to resource consumption, by enabling the second path and disabling the energy emitter, the first and the third paths; selecting a digital "flashing light" resource consumption meter mode wherein the energy emitter and first path are disabled and the second and third paths are enabled; selecting a reflective type resource consumption meter mode wherein the energy emitter is enabled and the second path is enabled and the first and third paths are disabled; selecting a self test mode wherein the energy emitter is enabled and the second and third paths are enabled and the first path is disabled; selecting an automatic meter detection mode wherein the energy emitter is enabled and the first, second and third paths are enabled.

BRIEF DESCRIPTION OF THE DRAWINGS

The foregoing and other objects, features and advantages of the invention will be apparent from the following more particular description of the preferred embodiments of the invention as illustrated in the accompanying drawings in which like reference characters refer to the same parts throughout the different views. The drawings are not necessarily to scale, emphasis instead being placed upon illustrating the principles of the invention.

FIG. 1b is a representation of another operating mode of one embodiment of the invention.

FIG. 2 is a representation of an emitted light pulse in the energy vs. time domain in another embodiment of the invention.

DETAILED DESCRIPTION

The Problem

A consumer may wish to monitor the state of a variety of resource consumption meters at their home or business. These may include electricity, water and natural gas meters. Consumer may not know exactly what kind of meter they have. It is desired to have an apparatus that can read information from a wide variety of metering systems in a non-invasive way while maintaining a high level of adaptability to different meter types by enabling or disabling circuitry that may not be needed in every meter installation.

A preferred embodiment of the invention contains four basic functions that can be enabled and disabled to allow a wide variety of meters to be sensed and read. These meters produce signals that have a first frequency that is relative to the rate of metered resource consumption. Therefore the invention must be able to detect these signals whether they are analogue or digital. In addition, the invention may be used to automatically detect what type of resource consumption meter system it is installed upon and then select the correct operating mode for operation on that system.

The basic functions of the preferred embodiment of the invention are described in Table 1.

The Circuit

Figure 1:
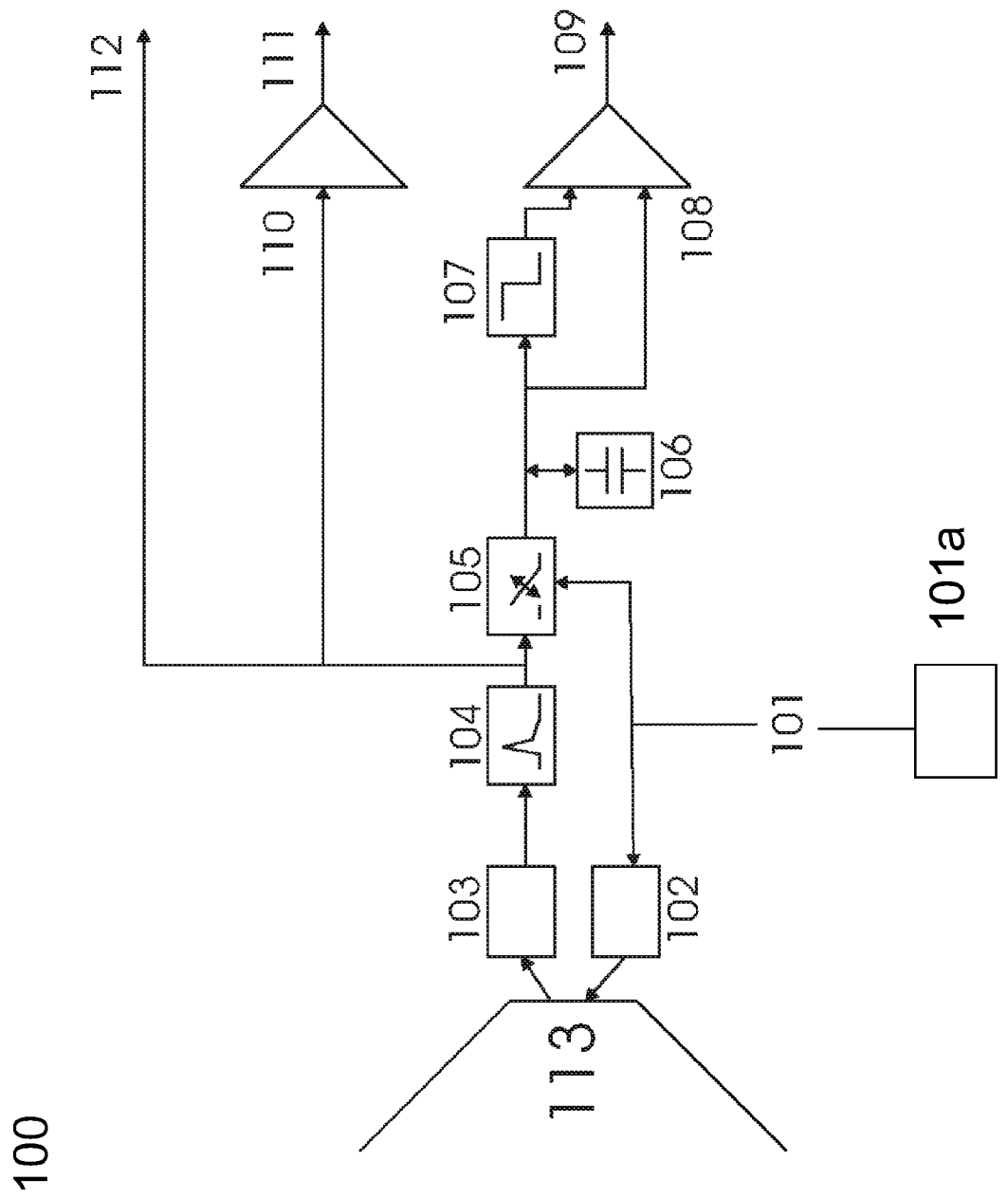
FIG. 1 is a representation of the functional blocks of one embodiment of the invention.

Referring now to FIG. 1, there is shown a block diagram of the apparatus of one embodiment of the invention. The apparatus is attached to a resource consumption meter (113) that emits a signal having a first frequency that is relative to the rate of metered resource consumption. The resource consumption meter may be digital or analogue and emits a signal in the form of an energy emission or by changing reflectivity through a spinning disk, LCD display or other means. Provided is at least one signal detection means to detect the signal from the meter. Also provided is a circuit (100) that is operatively connected to the at least one signal detection means and adapted to interpret the received signal for a human. In one embodiment the apparatus is an optical apparatus. The apparatus is adapted to detect signals either from an analogue resource consumption meter or a digital resource consumption meter. Where the resource consumption meter is an analogue meter, there is provided an energy emitter (102), such as an infrared light energy emitter, positioned such that it can illuminate a means for reflecting the energy, which is part of the analogue meter. This is the means by which the analogue signal is converted into an energy emission detectable by the signal detection means. For example an analogue meter may comprise an indicator such as a needle, dial, and shutter or mirror those changes to indicate the rate resource consumption. Therefore, there is also provided means for reflecting energy from the indicator to the energy detector (103). When connected to an analogue resource consumption meter, the emitter (102) is activated by an emitter signal (101) received from a microprocessor (101a). The emitter signal (101) is also used to enable a Sample and Hold Path (105) which is described in detail later. The emitter (102) is not required on systems which include an active indication of consumption such as many digital electricity meters which will flash their own integrated light source at a rate that varies to indicate the parameter being monitored.

Means for signal detection (103) is adapted to receive energy emissions from the active indicators as are often found in digital metering apparatus. The means for signal detection (103) may also be positioned to receive reflected, transmitted or transflective signals from the emitter (102). In one embodiment, there is at least one means for signal detection that is positioned to receive the reflected energy emission from the emitter. In another embodiment there is more than one means to receive the reflected energy emission.

The circuit includes a discriminator (104) that allows only rapid changes in the detector (103) signal to be amplified. For example, signals that are emitted and detected at a first frequency are the desired signals. Signals detected at a second frequency that is lower than the first frequency represent spurious and unwanted signals which need to be segregated. Such lower frequency signals often represent such anomalies as sunlight reflections. Therefore the discriminator provides a combination of low-frequency blocking to eliminate the effects that sunlight or other ambient conditions may cause. The discriminator also provides amplification of the desired first frequency signal.

In a preferred embodiment of the apparatus the at least one signal detection means operatively connected to the circuit provides for three optional circuit paths representing one of a sample and hold mode of operation adapted for analogue meters having a moving indicator indicative of resource consumption; a digitized mode of operation; and, an analogue to digital mode of operation. These different circuit paths are all related to the type of resource consumption meter that the apparatus is connected to and intended to read. As indicated in Table 1, one or more circuit pathways can be used at any time.

The Sample and Hold Pathway

Figure 1A:
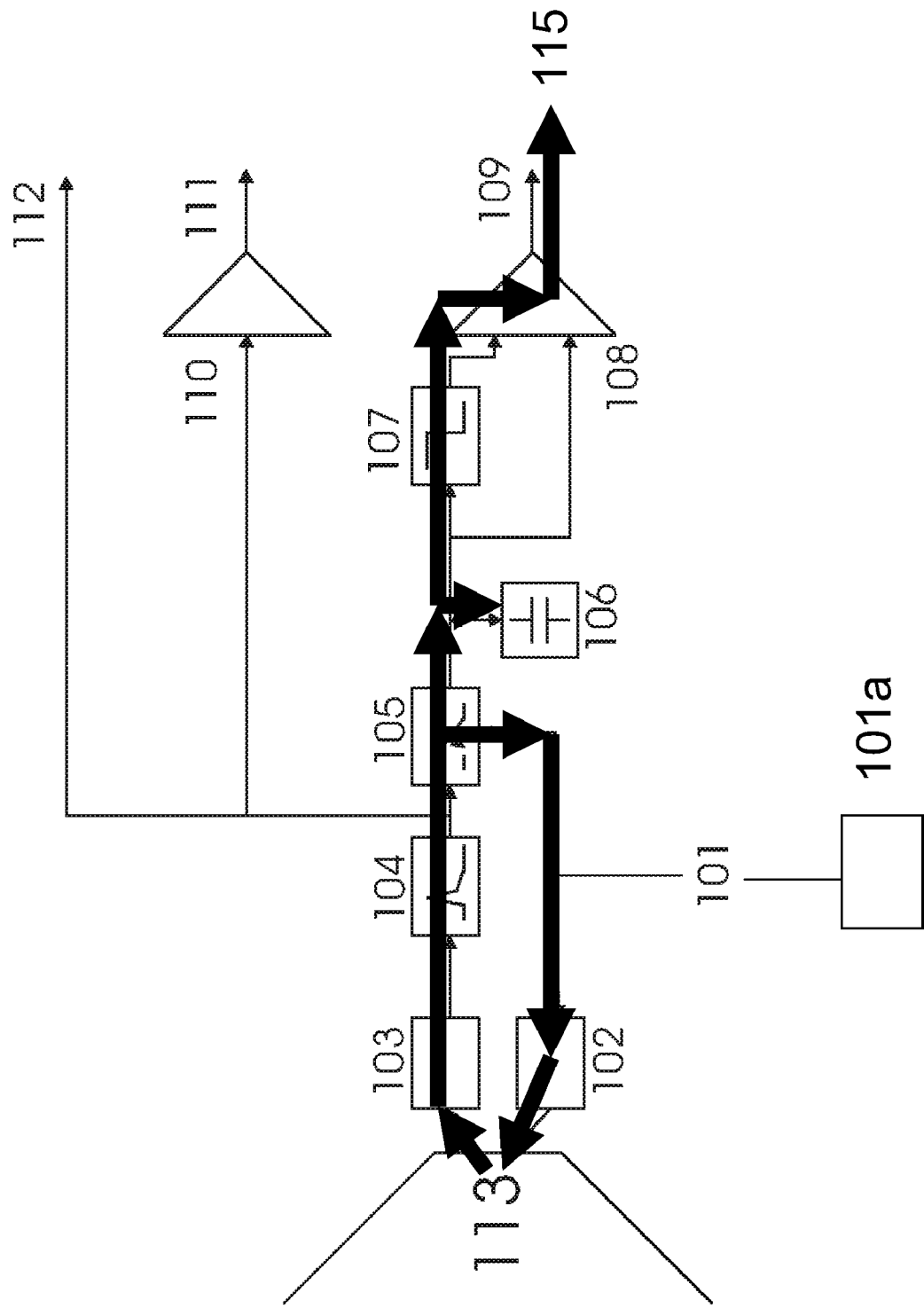
FIG. 1a is a representation of one operating mode of one embodiment of the invention.

Referring to FIG. 1a, in one embodiment of the invention, the Sample and Hold Path mode of operation (115) operates in a synchronous fashion with the emitter (102) and the energy emitter pulsing means (101a) that is the microprocessor. This is significantly different from signal filter systems normally employed in meter reading applications. A typical signal filter will accumulate signal information in an ongoing basis. The Sample and Hold Pathway mode of operation (115) allows signal information to only affect the output signal during the short period of time that the emitter (102) is actually pulsed. In this way spurious noise which occurs when the emitter is not being pulsed is not averaged into a final reading. It would be ignored. A second benefit of this mode of operation is the fact that it saves power. A conventional filter-based design requires a continuous stream of emitter (102) and detector (103) pulses which are then time-averaged to produce a final signal. Reducing the duty-cycle of the emitter would therefore result in a similar reduction in signal amplitude and would therefore lower the total signal-to-noise ratio of the system. Systems based on filtering tend to use system duty cycles greater than 1%. A system based on synchronized sampling can operate at duty-cycles less than 1% while maintaining a signal-to-noise ratio that is better than systems operating at much higher duty-cycle rates. Combining this with discriminator (104) mentioned earlier produces a superior total system.

Still referring to FIG. 1a, the signal from the Sample and Hold Path (115) is stored in signal storage means such as a capacitor (106) or using a similar voltage-preserving storage or memory. The signal storage means is adapted to store a predetermined number of signals having increasing magnitudes. The signal storage means (106) is preferably sized such that, in the event of a step-function on the received signal, several pulses from the Sample and Hold Path (115) are required for the signal storage means (106) to reach a steady-state voltage. This provides filtering against noise and reduces large power transients that may be caused if the circuit attempted to instantaneously bring the signal storage means (106) to a different voltage level. The signal from the signal storage means (106) is then fed to a filter (107). The filter (107) determines the magnitude of the ambient signal in the circuit. The filter is essentially a very long time constant filter which will stabilize to the average signal level of the circuit. The signal from the signal storage means is also transmitted to an amplifier (or comparator) (108) which subtracts the ambient signal from the detected signal from signal storage means (106). The signal output (109) from the amplifier (108) is therefore the difference between the present signal level and the average signal level of the system. Due to the long time constants involved, the signal output (109) is a slowly time varying signal. This allows the microcontroller and analog-to-digital converter in the system (not shown) to sample and interpret the signal in a non-real-time fashion with sampling rates that may be orders of magnitude slower than the actual emitter rates used. This can result in dramatic power savings. Alternatively, if an additional comparator was used with appropriate threshold levels chosen or a microprocessor controlled threshold, the output signal (109) may be tied to a digital input of a microcontroller, further reducing the need for signal post-processing and software.

The Digitized Pathway

Referring to FIG. 1b, the output of the discriminator (104) the signal may also follow pathway (116) and pass to a digitizing element (110) which will trigger only when a fast-timevarying signal is present on the output of the discriminator. The digitized pathway comprises an energy detector (103) adapted to detect energy directly from a digital resource consumption meter, a discriminator (104) operatively connected to the energy detector for blocking spurious signals and amplifying output signals and a digitizing element (110) adapted for receiving discriminator output signals and converting them to digital signals if the discriminator signals are fast time-varying signals of a predetermined magnitude. The output (111) from the element (110) would be connected directly to a microprocessor input for processing and subsequent interpretation by a human. This type of fast signal will also occur if, for example, the detector (103) senses the infrared output pulse directly from a digital electricity monitor. If the system is also enabling the emitter (102) then the digital output (111) would activate each time an emitted pulse was detected. This provides a useful self-test feature and can also be used to automatically detect the type of meter the unit is installed upon. This is explained in more detail later.

A further aspect of the digitizing element (110) is the ability to digitize not only the presence of the fast-time-varying signal, but also the magnitude of such signal. The digital output (111) will stay active for a period that is proportional to the strength of the fast-time-varying signal pulse itself. When used to detect infrared emitter pulses from an active metering system, the active period length will indicate how well aligned the detector (103) is to the emitter source. This also works when the system is emitting pulses using the emitter (102) and can indicate alignment on the meter (113) itself.

Analog to Digital Pathway

Figure 1C:
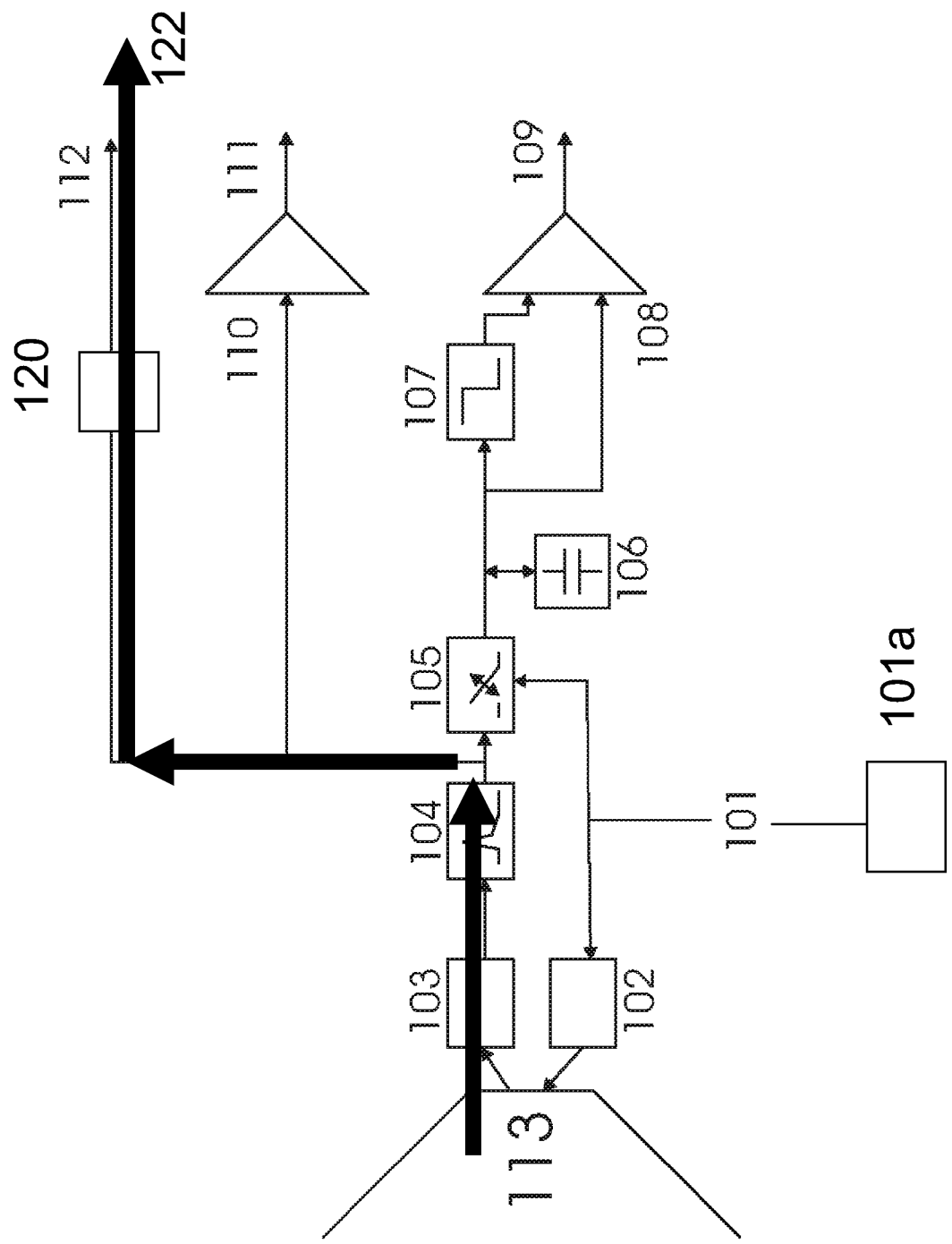
FIG. 1c is a representation of yet another operating mode of one embodiment of the invention.

Referring to FIG. 1c, the output of the discriminator (104) the signal may also follow pathway (122). This pathway may comprise an energy emitter (102) adapted to illuminate an indicator on an analogue resource consumption meter with a plurality of short pulses over a defined period of time. The emitter is not required on systems that may self-illuminate such indicator or will produce an emission that can be detected by a detector that has an analog output rather than a digital output. The pathway will always comprise an energy detector (103) adapted to detect energy from the indicator over the defined period, a discriminator (104) operatively connected to the energy detector for blocking spurious signals and amplifying permitted signals. An analogue to digital converter (120) would be used for converting the signal (112) to a digital signal to a microprocessor for interpretation for a human. The microcontroller is adapted to measure the analog voltage at any time. This mode of operation can be used to search for asynchronously occurring pulses at the detector (103) which would indicate that the unit is installed on an active digital meter. When used on an analog meter where the system uses an emitter (102) to generate pulses, measuring the peak of the discriminator pulse (104) can be used to measure if the system is properly aligned, and to set appropriate automatic gain levels.

Automatic gain may be implemented by voltage controlled gain elements at the digitizing element (110), or the amplifier (108) or using software methods on the analog signal itself. Automatic gain may also be implemented using novel methods such as: dynamically changing the power delivered to the emitter (102); by varying the duty-cycle of the emitter (102); or by varying the sensitivity of the detector (103).

Referring now to FIG. 2, there is shown a representation of an emitted light pulse in the energy vs. time domain (200). For simplicity, the emitter (FIG. 1, Item 102) would be enabled for a period of time (202) with a rapid rise time (203) and a constant power output (201). This results in a generally square waveform of emitter power. Other wave shapes may be used with a variety of advantages. Slower rise times (203) may be employed to reduce spurious emissions and noise. The power level (201) may be increased at the leading edge of the pulse to compensate for and effectively speed up the slow-response of the light detector. Various wave shapes may also be used as a means of further discriminating the source of the detected signal to effectively increase signal to noise ratio in the signal.

Figure 3:
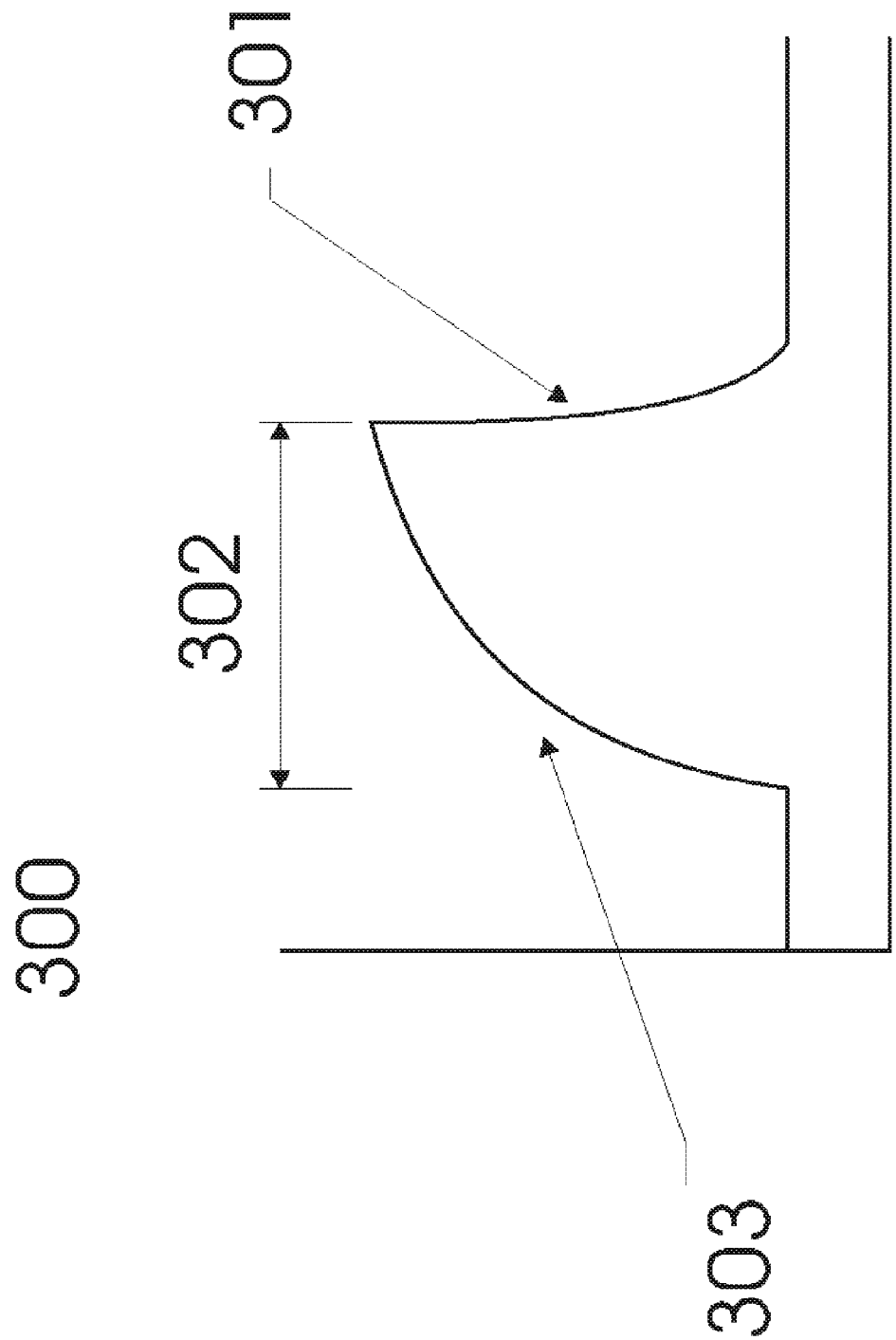
FIG. 3 is a representation of a detected light pulse originating from self-excitation in the energy vs. time domain in one embodiment of the invention.

Referring now to FIG. 3, there is shown is a representation of a detected light pulse at the output of the discriminator (104) as shown in FIG. 1. This originates from self-excitation in the energy vs. time domain (300) when the system is exposed to an excitation pulse shown in FIG. 2. The ramp-up time (303) will generally have an exponential shape due to the response time of the light sensor, system capacitance, inductance and resistance. Certain active elements such as amplifiers may also influence the ramp-up time. The total pulse length (302) will generally be similar to the original excitation signal but the pulse may be slightly longer due to ramp-down time (301) caused by many of the same factors as the ramp-up time (303). The overall magnitude of the pulse is dependent on many factors including, but not limited to, the magnitude of the excitation signal, reflectivity of the source and sensitivity of the detector. The responsiveness of the detector (103) and discriminator (104) combination shown in FIG. 1 would be tuned to the expected excitation pulse period which will be used. The pulse period would preferably be less than 100 uS and would occur at a rate that is preferably greater than 100 Hz such that the overall duty-cycle was less than 1%.

Figure 4:
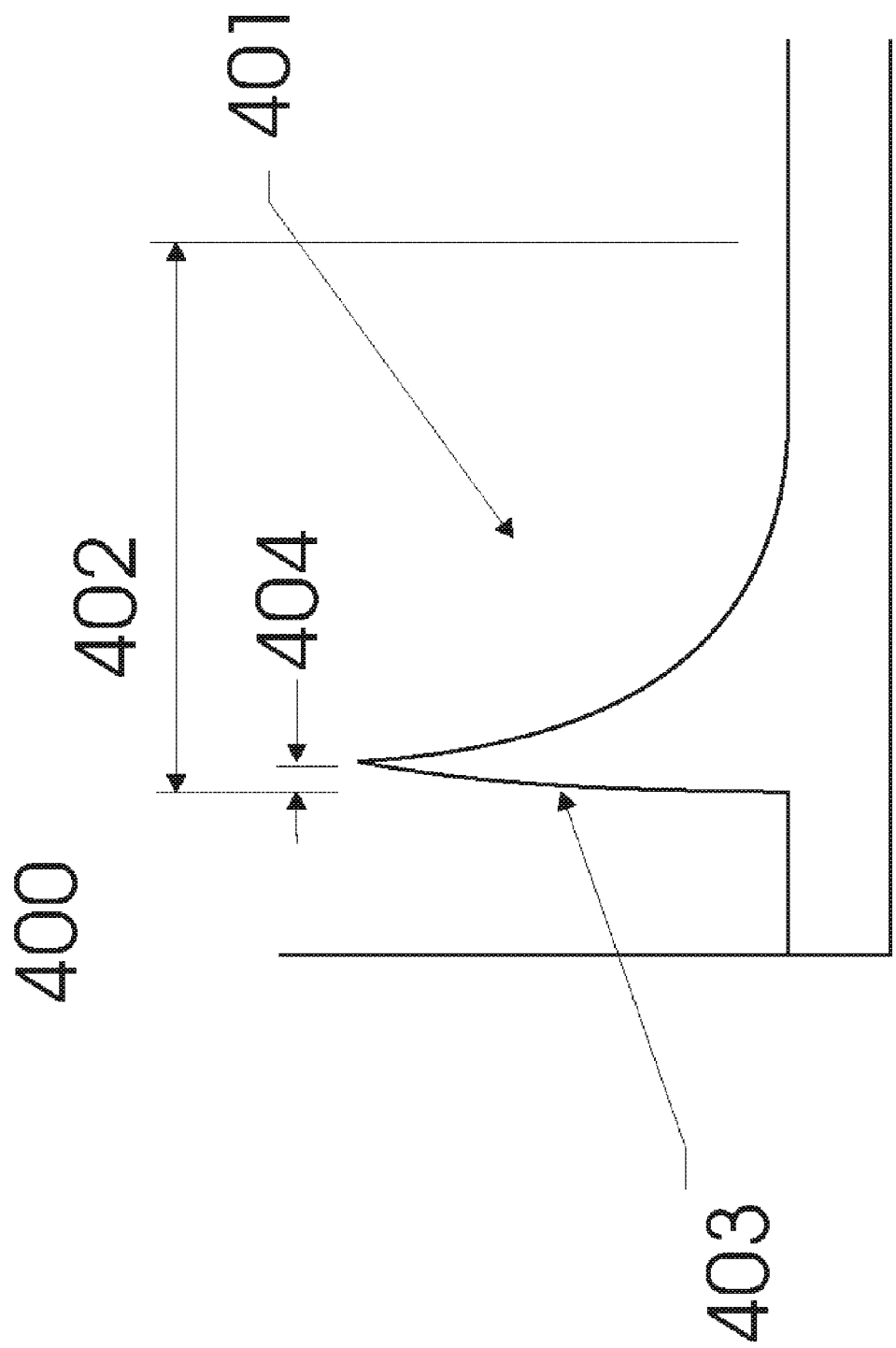
FIG. 4 is a representation of a detected light pulse originating externally to the system in another embodiment of the invention.

Referring now to FIG. 4, there is shown a representation (400) of a detected light pulse originating externally to the apparatus such as from a digital meter. Many metering systems use an emitted light pulse that is 10 mS long (402, not to scale). This is much larger than the chosen response time (404) of the detector (103) and discriminator (104) shown in FIG. 1, which would typically be less than or equal to 100 uS. The detected light pulse will therefore ramp-up (403) in a way that is similar to a self-excitation pulse, but after the response time (404) was exhausted, the signal ramps-down (401) over the remaining period. This has several advantages for reading metering systems that have an infrared output signal. The primary advantage is that the system will detect externally generated light pulses regardless of duration, provided they are longer than 100 uS. Even if the externally generated light pulses contain modulated data, as some modern meter do, the overall information burst will be detected by the system. The second advantage is that the externally generated pulse is converted into a fast-time-varying signal which is suitable for triggering the digitizing element (110) shown in FIG. 1.

Figure 5:
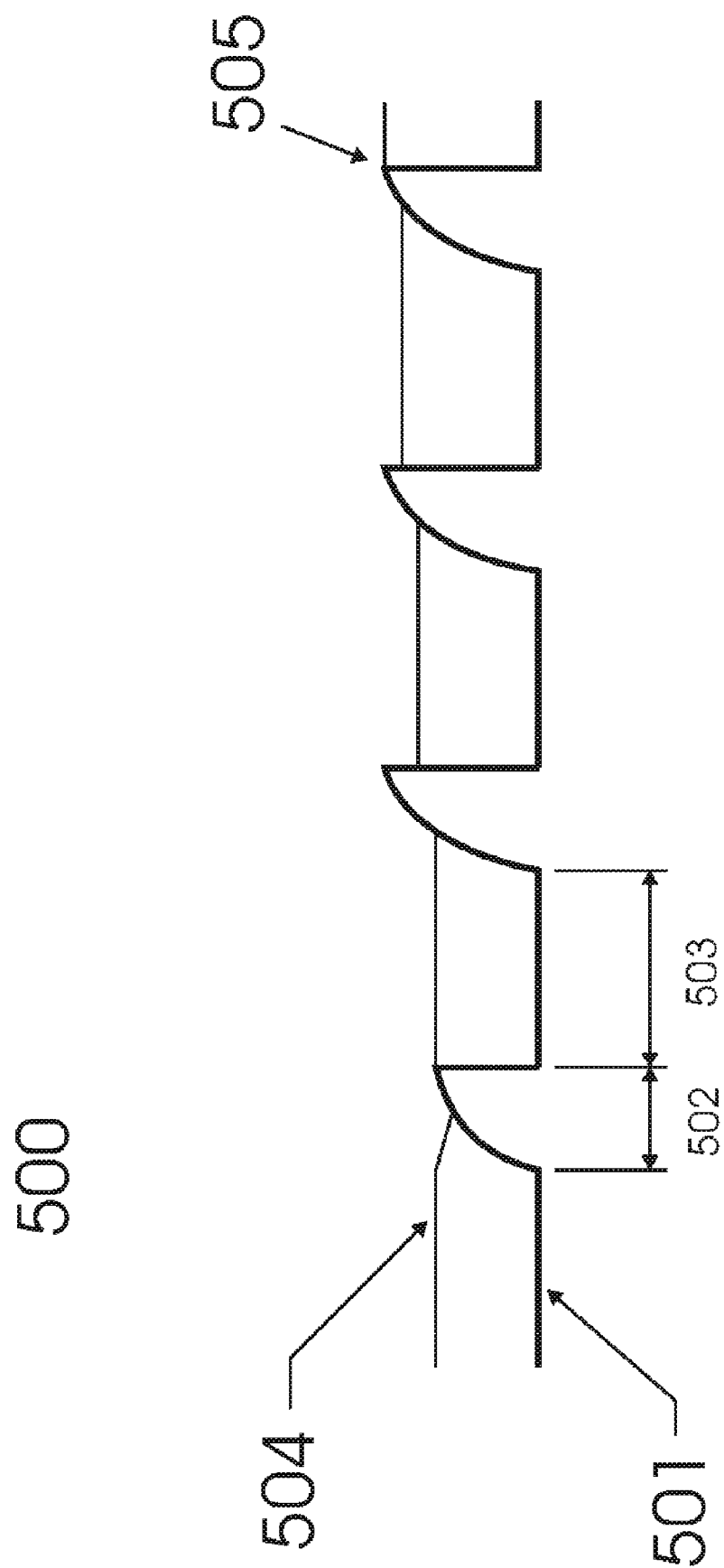
FIG. 5 is a representation of a repetitive series of detected pulses and a tracked signal related to them in one embodiment of the invention.

Referring now to FIG. 5 there is shown a representation (500) of a repetitive series of detected pulses and a tracked signal related to them. The first pulse shown in the series is at a lower magnitude than the following three pulses. This would be representative of a change in the signal being monitored (FIG. 1, Item 113). Two voltage signals are shown with respect to time. The signal from the output of the discriminator (104) shown in FIG. 1 is shown as the thick line discriminator signal (501). The Sample and Hold Path (105) output shown in FIG. 1 is shown as the thin line tracking signal (504). A single received pulse (502) is shown followed by a period where the excitation is not active (503). The time intervals are not shown to scale as the received pulse (502) is typically less than 1% of the total period. It can be seen that the tracking signal (504) attempts to follow the discriminator signal (501), but it does not follow it instantly; it may take several pulses before the signals match (505). There may also be some offset voltage or the signals may be at different scales to each other, this is not shown for simplicity reasons, the main feature is that the signal stabilizes to a known value with respect to the input signal.

Figure 6:
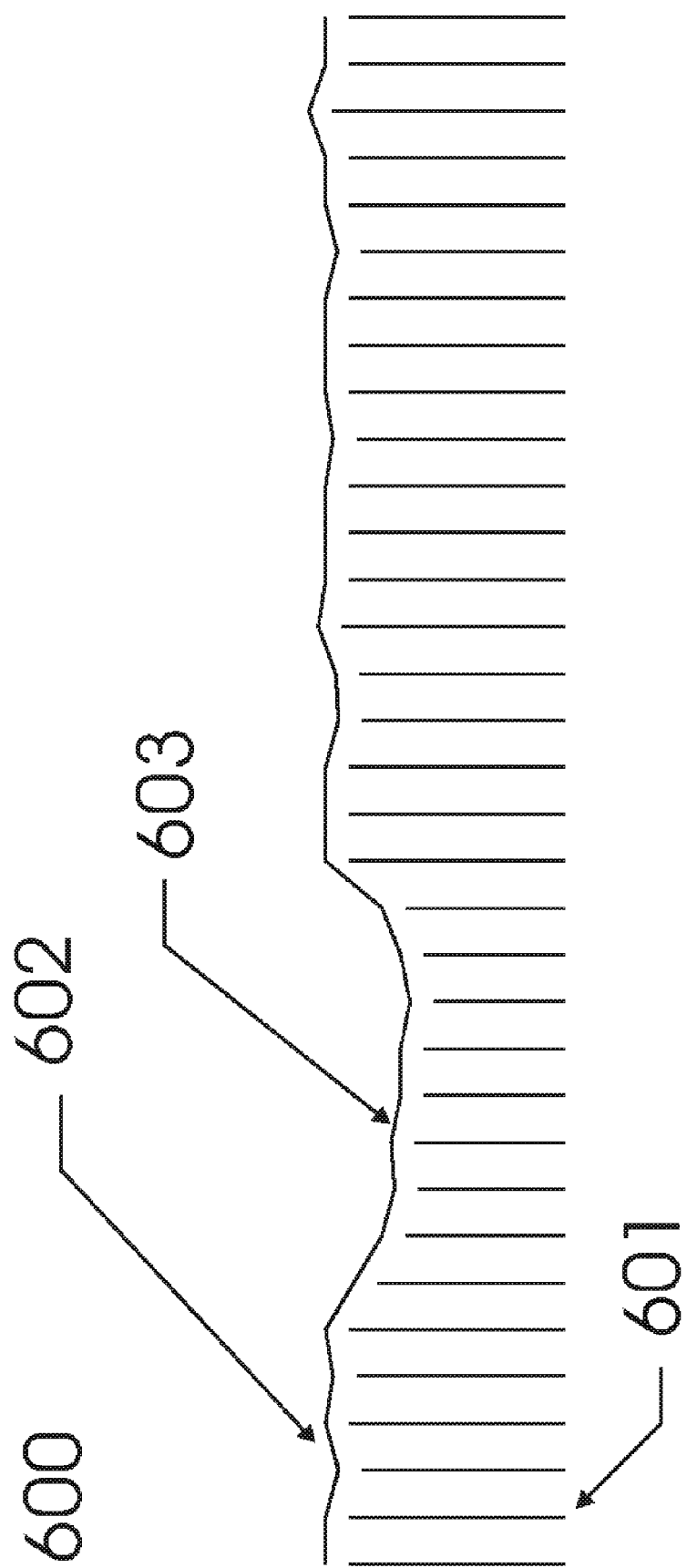
FIG. 6 is a representation of a longer series of detected pulses, a tracked signal, and signal variation in one embodiment of the invention.

Referring now to FIG. 6 there is shown a representation of a longer series of detected pulses (600), a tracked signal and signal variation. A slight offset voltage is shown between the individual pulses (601) and the tracking signal (602). A sustained dip (603) in detected energy will be reflected in the tracking signal. This sustained dip may be caused by the black-band of a spinning disk inside an electricity meter. In this case the dip may be less than 0.1% of the total signal height because the small change in reflected energy as a spinning disk goes by compared to the amount of reflection from the glass covering the meter, the metal on the face of the meter, and even cross-talk directly between the emitter and detector elements. Therefore this diagram is exaggerating the size of the dip, which may not even be visible with conventional oscilloscopes or to a low resolution digital to analog converter system.

Figure 7:
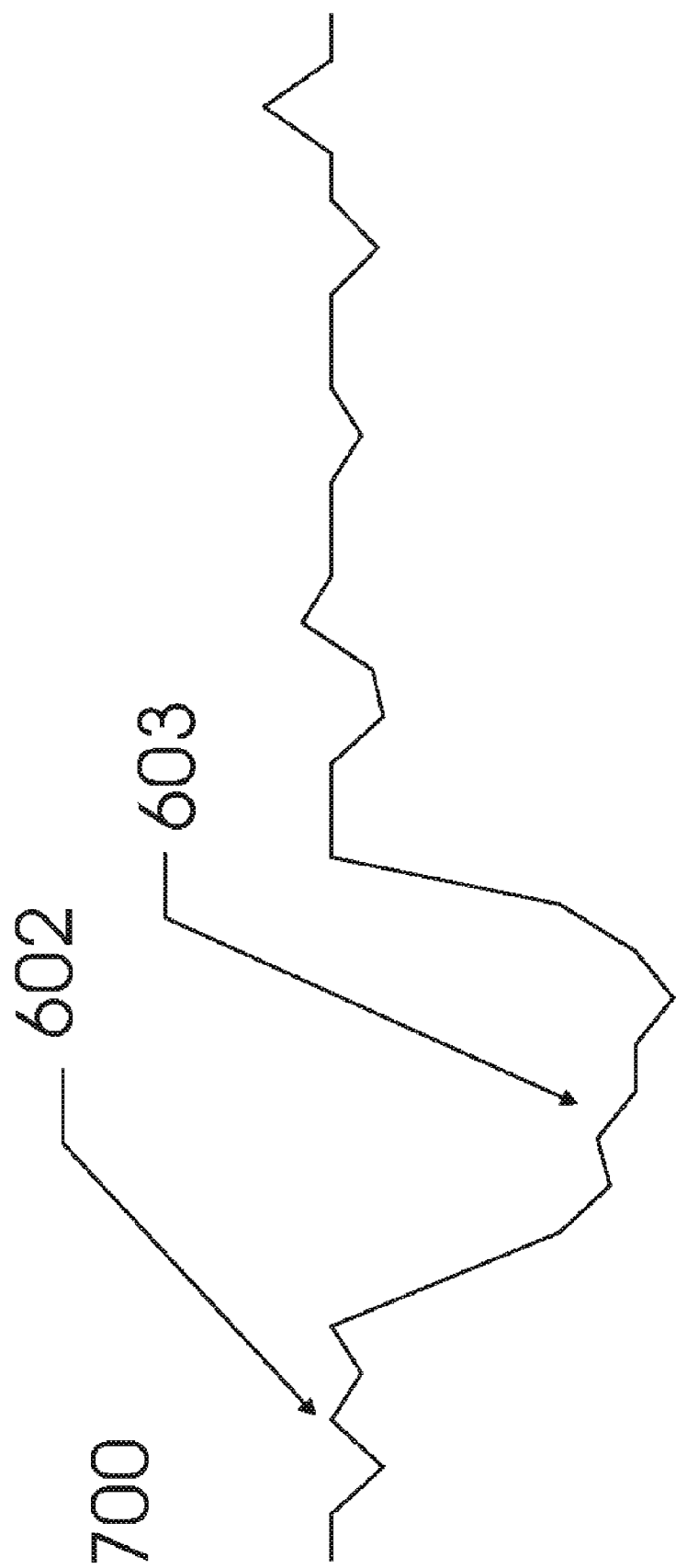
FIG. 7 is a representation of the modified signal variation from FIG. 6.

Referring now to FIG. 7 there is shown representation (700) of the modified signal variation from FIG. 6. This is the expected output from an amplifier (108) shown in FIG. 1. By removing the average signal level from the present signal level, the magnitude of the dip is greatly amplified and is easy to detect either by digital means, or through the use of an analog to digital converter and appropriate software threshold methods as are known in the art.

Referring again to Table 1 of operating modes, with each mode annotated with an arbitrary reference number, a detailed description of each operating mode will be presented.

Mode 1: Disabled

The system is not emitting or detecting anything. This would be a standby or off state for the system.

Mode 2: Not Useful

The excitation source is being operated, but none of the system outputs are being monitored. This is not a useful mode during normal operation, but could be used during system production testing.

Mode 3: Alternate Digital "Flashing Light" Meter

By enabling only the analog path from the detector, the system has the ability to continuously search for light perturbations at the input of the system which would originate from an external light source. This can be used to directly measure pulsed light output from a digital meter, or it may be used to measure the magnitude of a digital light pulse. Magnitude information may indicate mechanical alignment properties, power consumption properties, or other system information.

Mode 4: On/Off Passive Meter

Some meters may use a display device which is dependent on external light. A Liquid Crystal Display is a good example of a device that is normally read using ambient lighting. Some meter types have a flashing black square, bar graph, or other indicator that indicates rate of consumption. Enabling the excitation source allows this indicator to be read by the detector as the level of light absorbed by the meter will vary as the indicator changes. This variation can then be read by digitizing the detector signal with an analog to digital converter using the Analog Path of the system.

Mode 5: Not Useful

By enabling only the Sample and Hold path from the detector, but without activating the sample-and-hold element itself through the use of the excitation source, no useful information can be gained, with the exception of zero-offset voltages or other production or testing information.

Mode 6: Analog Spinning Disk Meter

The most common electricity meter is based on a spinning disk that has a black-mark on it. Other meter types such as gas and water may also be read using this mode of operation. The excitation source is enabled and the reflected energy at the detector is sampled and compared to the average reflected energy. Perturbations in the reflected energy are amplified and digitized into the microcontroller. The microcontroller can then count the disk rotations and measure the time between rotations to determine power consumption.

Mode 7: See Mode 3 and Mode 5

This mode effectively encompasses the features of Mode 3, but also has the uselessness of Mode 5 and would therefore not be used in normal operation.

Mode 8: Automatic Gain Control

In mode 6 an analog spinning disk is read by enabling the emitter and reading back perturbations in the reflected energy. However, if too much energy is being emitted by the emitter, then the circuit elements may overload and therefore the perturbations may not be seen. Similarly, if the system is poorly mounted resulting in minimal reflected energy, then perturbations caused by the black-mark on the disk may not be seen. By monitoring the Analog Path either continuously, or occasionally, the actual analog value of the detected signal can be read. If this signal is very large, then the excitation energy can be reduced (or gain may be reduced) until the signal falls into the normal operating range of the circuit elements. Similarly, if the detector signal is too small, then excitation energy can be increased (or gain can be increased) to increase reflected energy and attempt to bring the signal back into a useable range.

This effectively implements automatic gain based on reflected energy directly, rather than guessing at reflected energy by looking only at the Sample-and-Hold path.

Mode 9: Digital "Flashing Light" Meter

A meter type that uses an active display, meaning a display that emits radiation at a rate that is proportional with consumption, can be read in this mode. The detector energy is fed into a digitizing comparator or similar system that will produce a digital output when the detector sees a pulse of light. Many digital meters include an infrared emitter that pulses for 10 mS for every 1 watt-hour of energy consumed. This mode of operation would be used to monitor this infrared light source.

Embedded digital information may also be read in this mode. For example, some digital resource monitors may flash the light to indicate consumption, but will further modulate the flashing to indicate other parameters such as power factor or temperature. The time between macro pulses may therefore indicate one parameter while the inter-pulse modulation may contain additional data.

Mode 10: On/Off Reflective Type

Any meter that contains a highly reflective surface that can be obscured, tilted or mechanically moved can be monitored in this mode. The emitter source is used to flood the surface to be measured, if the surface is highly reflective, enough of the emitter energy will be reflected into the detector to cause the digital output of the system to activate. If the surface is not reflective then the digital output will not be active. The difference between reflective and non-reflective need to be fairly large, larger than the differences seen with standard spinning-disk meters when the black-mark passes the detector.

A reflective LCD with a mirrored back would provide sufficient On/Off reflectivity to be monitored using this mode. Needles, peep-holes and pendulums would be other candidates for monitoring using this mode.

Mode 11: Alternate Digital "Flashing Light" meter—Automatic Detection

This mode is very similar to Mode 3 with the exception that if the light source is strong enough, it would activate the digital output. Using this detection mode would allow the system to detect flashing light outputs, and to determine if the signal levels were high enough to switch to Mode 9 monitoring only the Digital Output Path, or if the system should switch to Mode 3, monitoring only the Analog Output Path.

Mode 12: Self Test Mode

In this mode the output of the excitation source would be coupled into the detector using a highly reflective surface. The Digital Output Path will activate whenever the excitation source is switched on, and the Analog Path can be monitored to ensure the magnitude of the detected energy meets system expectations.

Mode 13 to 15: Not Useful

These modes are effectively combinations of other system modes and would not normally be operated on their own except in calibration, production test or self-test operations.

Mode 16: Automatic Meter Detection

This is possibly the most useful mode in which the system can operate. When the system is mounted on a meter, for example an electricity meter, the system would not know if it was mounted to a digital meter with a flashing light output, or an analog meter with a spinning disk.

The system would enable all sense paths and the excitation path.

By continuously digitizing the Analog Path using an analog to digital converter, the system can look for tell-tale spikes that indicate the detector has received excitation energy. The system knows when the excitation source is enabled. Therefore the system can perform a simple evaluation on each spike and use that information to determine system type:

1. If the spike occurs at the same time as the excitation source was enabled, then it is likely self-excitation. If the spike is smaller or larger than the previous spike then monitor the Sample and Hold Path to determine if the signal changes look like an analog spinning disk meter with the black-band traversing the detector.
2. If the spike occurs asynchronously to the excitation source, then the excitation energy occurred externally to the system and the system is therefore mounted on some form of digital meter with an active light output.

The above monitoring can take place for tens of seconds, minutes, or even hours with a certain number of positive identifications, or ratio of meter type being required before the system jumps to an operating mode which is optimized for only the detected meter type. This would be done primarily to save power.

Although the description above contains much specificity, these should not be construed as limiting the scope of the invention but as merely providing illustrations of some of the presently preferred embodiments of this invention. Thus the scope of the invention should be determined by the appended claims and their legal equivalents.

What is claimed is:

1. An apparatus for attachment to a resource consumption meter emitting a digital or analog consumption signal having a frequency indicative of a rate of a resource being metered by the resource consumption meter, said apparatus comprising:
    a. at least one signal detector for optically detecting said digital or analog consumption signal from said resource consumption meter; and
    b. a circuit operatively connected to said at least one signal detector for determining a type of the consumption signal and processing said consumption signal in accordance with the type to produce a human readable output indicating a state of the resource consumption meter.

2. The apparatus as claimed in claim 1 wherein the apparatus further comprises a light emitter for emitting an excitation signal onto a reflector of the resource consumption meter, the reflector operating at a frequency relative to the rate of resource consumption, wherein the reflector reflects the excitation signal to generate the consumption signal.

3. The apparatus as claimed in claim 1 wherein said resource consumption meter is a digital meter the consumption signal comprises a light emission from said meter.

4. The apparatus as claimed in claim 1 wherein said resource consumption meter is an analog meter the consumption signal comprises reflected light emission from said analog meter.

5. The apparatus as claimed in claim 2 wherein the excitation signal is a synchronized light pulse in the energy vs. time domain that is operable to be enabled for a time with a rapid rise time and a constant power output, said excitation signal resulting in a square waveform of emitter power utilizable to generate the consumption signal.

6. The apparatus as claimed in claim 2 wherein the excitation signal is a synchronized light pulse having a waveform that employs a slower rise time and increased power level at a leading edge of the synchronized light pulse for increasing the signal to noise ratio of the consumption signal.

7. The apparatus as claimed in claim 1 wherein the circuit includes a discriminator operable to determine the frequency of input signals from the signal detector and to block ambient input signals having a frequency lower than the frequency of input signals that are the consumption signals, said consumption signals being output by the discriminator to one or more of the following:
    a. a digitizing element operable to convert the consumption signals to digital signals if the discriminator signals are fast time-varying signals of a predetermined magnitude; and
    b. a microprocessor included in the circuit operable to process the consumption signals or digital signals to produce the human readable output indicating the rate of metered resource consumption;
wherein said ambient input signals represent spurious energy signals not related to resource consumption.

8. The apparatus as claimed in claim 7 wherein said discriminator is operable to amplify the consumption signals and to output amplified consumption signals to the digitizing element.

9. A method for monitoring resource consumption utilizing an apparatus that is attachable to a resource consumption meter that emits a consumption signal having a frequency indicative of the rate of metered resource consumption, said method comprising the following steps:
    a. at least one optical signal detector optically detecting a consumption signal from the resource consumption meter;
    b. a circuit operatively connected to the at least one optical signal detector detecting the consumption signals and recognizing the consumption signal type, the circuit further processing detected consumption signals and generating human readable output indicative of the rate of metered resource consumption by alternating between a plurality of circuit paths included in the circuit in accordance with the consumption signal type, said plurality of circuit paths operating one or more of the following modes of operation:
        i. a sample and hold mode of operation for generating the human readable output utilizing a consumption signal type emitted from the resource consumption meter that is an analog meter having a reflective indicator indicative of resource consumption;

ii. a digitizing mode of operation for generating the human readable output utilizing a consumption signal type emitted from the resource consumption meter that is a digital meter having an integral emitter; and iii. an analog-to-digital mode of operation for generating the human readable output utilizing a consumption signal type emitted from the resource consumption meter that measures measure detected energy from an integral emitter or reflected energy.

10. The method as claimed in claim 9, comprising the further steps of the sample and hold circuit path:

a. a microprocessor controlling the generation of a plurality of short pulses over a defined duration of a light emitter pulsing means that is operatively connected to a light emitter and synchronized to a light detector;

b. the light emitter illuminating said reflective indicator with the plurality of short pulses that are fast-rising square wave pulses having an adjustable period and power;

c. a light detector detecting reflected light input signals from the reflective indicator during said defined duration; providing said plurality of short pulses over the defined duration;

d. a discriminator operatively connected to said light detector detecting the light input signals at a high frequency as consumption signals and detecting light input signals at a lower frequency than the consumption signals as spurious input signals, and the discriminator blocking the spurious input signals;

e. storing a predetermined number of input signals of increasing magnitude over said defined duration in a signal storage means that is operatively connected to the discriminator until fully charged, and the signal storage means discharging a discharge signal if exposed to said predetermined number of input signals that are decreasing in magnitude over the duration;

b. a filter connected to said signal storage means determining the magnitude of an ambient signal on the circuit path;

c. a comparator element connected to said filter subtracting said ambient signal from said stored signal to produce an output signal, and the comparator element amplifying the output signal;

d. an analog-to-digital converter connected to said comparator receiving the output signal and converting the output signal into a digital signal; and i. the microprocessor receiving said digital signal and converting the digital signal to the human readable output.

11. The method as claimed in claim 9, comprising the further steps of the digitizing circuit path:

a. an energy detector detecting a light energy emission directly from a digital resource consumption meter;

b. a discriminator operatively connected to said energy detector detecting consumption signals from the detected light energy as having the highest frequency of the detected light energy, the discriminator extracting consumption signals from said detected light energy, the discriminator amplifying the consumption signals, and the discriminator producing discriminator output signals that are fast time-varying signals of a predetermined magnitude; and c. a digitizing element connected to the discriminator receiving said discriminator output signals and converting the discriminator output signals to digitizing element digital signals output, inputting the digitizing element digital signals output input into a microcontroller, and said microcontroller processing the digitizing element digital signals output into energy units and the human readable output.

12. The method as claimed in claim 11, comprising the further step of the digitizing element producing a digitizing element output as long as said discriminator output signal exceeds said predetermined magnitude.

13. The method as claimed in claim 12, comprising the further step of the light energy detector detecting emitted light energy directly from a digital resource consumption meter.

14. The method as claimed in claim 9, comprising the further steps of the analog-to-digital circuit path:

a. a microprocessor controlling a light energy pulsing means that is connected to a light energy emitter, said light energy pulsing means producing a plurality of light energy pulses over a defined period of time, and said light energy emitter emitting the plurality of light energy pulses as light energy;

b. the plurality of light energy pulses illuminating an indicator on an analog resource consumption meter;

c. a light energy detector detecting light energy from said indicator over said period of time;

e. a discriminator connected to the energy detector extracting input signals from the light energy having a frequency related to the rate of resource consumption as consumption signals, the discriminator rejecting input signals having a frequency lower than the frequency of the consumption signals, and the discriminator amplifying the consumption signals;

f. an analog-to-digital converter connected to said discriminator converting the consumption signals to digital signals; and g. a processing microprocessor connected to said analog-to-digital converter receiving the digital signals, the processing microprocessor processing the digital signals, and the processing microprocessor generating the human readable output.

15. An apparatus attachable to a resource consumption meter and said apparatus being operable to monitor the resource consumption meter that emits a consumption signal having a frequency relative to a rate of metered resource consumption, said apparatus comprising:

a. a light energy emitter operable to illuminate an analog indicator, said analog indicator being operable to reflect emitted light energy as the consumption signal;

b. at least one light energy detector operable to detect the emitted light energy and to determine the emitted light energy type;

c. a circuit connected to said at least one light energy detector, said circuit being operable to generate an output signal, said circuit including three alternative circuit paths to generate the output signal in accordance with the emitted light energy type and said three alternative circuit paths representing at least one of the following:

i. a first path operable as a sample and hold mode of operation being utilizable with the resource consumption meter that is an analog meter having a moving indicator indicative of resource consumption;

ii. a second path operable as a digitizing mode of operation; and iii. a third path operable as an analog-to-digital mode of operation; and d. a microprocessor operable to process the output signal and to generate human readable output.

16. The apparatus of claim 2 wherein an emitter microprocessor connected to the light emitter is operable to deliver a signal that causes the light emitter to be altered from an inactive to an activate.

17. The apparatus of claim 1 wherein an analog to digital converter is connected to a circuit path of the circuit and is utilizable to determine the consumption signal type by digitizing the circuit path and monitoring for spikes indicating that the consumption signal received by the signal detector is excitation energy, and an excitation source is connected to the circuit and is monitored to determine when it is enabled and each spike is evaluated as follows:

a. if the spike occurs simultaneously with the enablement of the excitation source then it is deemed self-excitation and it is determined that the resource consumption meter emits an analog consumption signal type, and if the spike is smaller or larger than the previous spike then it is determined whether the signal changes represent emissions from the resource consumption meter that is an analog spinning disk meter; and b. if the spike occurs asynchronously to the excitation source enablement then the excitation energy is deemed external to the system and the resource consumption meter emits a digital consumption signal type.

* * * * *

UNITED STATES PATENT AND TRADEMARK OFFICE
CERTIFICATE OF CORRECTION

PATENT NO.        : 8,085,164 B2
APPLICATION NO.   : 11/610222
DATED             : December 27, 2011
INVENTOR(S)       : Carkner Page 1 of 1

It is certified that error appears in the above-identified patent and that said Letters Patent is hereby corrected as shown below:

On the title page item [73], insert --Blue Line Innovations Inc., St. John's, Newfoundland (CA) --
Delete "Blue line Innovations., Moneton, New Brunswick"

Signed and Sealed this
Third Day of July, 2012

David J. Kappos
*Director of the United States Patent and Trademark Office*